United States Patent [19]

Ushikoshi et al.

[11] Patent Number: 5,483,162

[45] Date of Patent: Jan. 9, 1996

[54] MAGNETIC DETECTOR FOR A FREQUENCY GENERATOR RESPONSIVE TO MOTOR ROTATION

[75] Inventors: Isao Ushikoshi; Hayato Naito, both of Komagane, Japan

[73] Assignee: Sankyo Saiki Mfg. Co., Ltd., Nagano, Japan

[21] Appl. No.: 967,749

[22] Filed: Oct. 28, 1992

[30] Foreign Application Priority Data

Oct. 30, 1991 [JP] Japan ............................... 3-097310 U
Oct. 31, 1991 [JP] Japan ............................... 3-098137 U

[51] Int. Cl.$^6$ ........................... G01R 33/06; G01B 7/14; H03K 17/90; H03K 19/18
[52] U.S. Cl. ................. 324/252; 324/235; 324/207.21; 338/32 R; 327/510
[58] Field of Search ................ 324/207.21, 207.20, 324/207.24, 207.25, 207.26, 235, 252, 260, 262; 338/32 R; 307/309

[56] References Cited

U.S. PATENT DOCUMENTS

| | | | |
|---|---|---|---|
| 3,979,775 | 9/1976 | Schwarz | 324/252 X |
| 4,075,671 | 2/1978 | Cheatham et al. | 324/252 X |
| 4,649,342 | 3/1987 | Nakamura | 324/252 X |
| 4,806,860 | 2/1989 | Iijima et al. | 324/252 X |
| 4,914,387 | 4/1990 | Santos | 324/252 X |
| 5,243,280 | 9/1993 | Kusumi | 324/252 |

Primary Examiner—Sandra L. O'Shea
Assistant Examiner—Warren S. Edmonds
Attorney, Agent, or Firm—McAulay Fisher Nisen Goldberg & Kiel

[57] ABSTRACT

A magnetic detector, such as is used in a frequency generator, for detecting the rotational rate of a motor includes magnetic resistance elements and an operational amplifier. The magnetic resistance elements have a predetermined resistance ratio and are connected serially between a power source and ground. The common node between the two magnetic resistance elements serves as an output terminal for providing an output voltage. The output voltage from the output terminal being supplied to one of the two input terminals of the amplifier. The voltage from a resistance voltage divider disposed between the power source and ground is supplied to the other input terminal of the amplifier. A change of the resistance ratio between the two magnetic resistance elements is effected by a resistor disposed in series with the elements or in parallel with one of the elements. This change serves to equalize the DC component of the output voltage and the divided voltage and, consequently, common mode noise level effects of the power source are substantially eliminated.

6 Claims, 4 Drawing Sheets

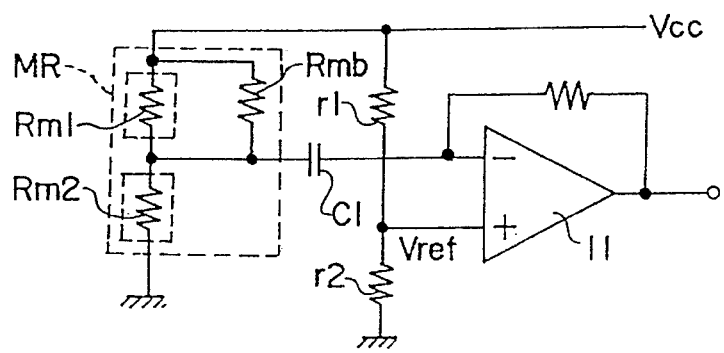
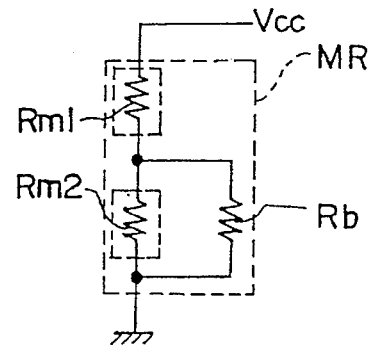
FIG. 3a  FIG. 3b
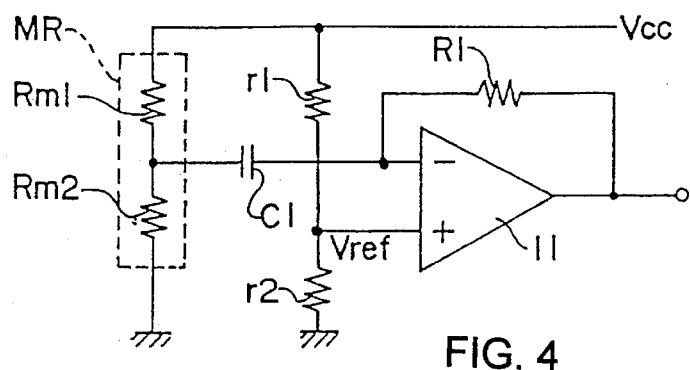
FIG. 4

MAGNETIC DETECTOR FOR A FREQUENCY GENERATOR RESPONSIVE TO MOTOR ROTATION

BACKGROUND OF THE INVENTION

This invention relates to a magnetic detector using a magnetic resistance element and, more particularly, the application of such detector as a frequency generator incorporated in a motor.

BACKGROUND OF THE RELATED ART

Frequency generators housed within a motor are used to detect the rotational rate of a motor. One type of such frequency generator comprises a ring magnet which is magnetized in such a manner that N and S poles occur at an interval alternately in the circumferential direction. The ring magnet is provided on a rotor. The frequency generator also includes a magnetic detector comprising a magnetic resistance element and an amplifier, etc. which outputs signals of the frequency proportionate to the rotational rate by detecting the magnetic poles of the above mentioned magnet.

FIG. 9 shows the equivalent structure of a prior art magnetic detector circuit. In the figure, two magnetic resistance elements m1 and m2 are serially connected between a power source Vcc terminal and a ground terminal. Elements m1 and m2 have their respective resistance in a 1:1 relationship, and are structured as a unilateral bridge. Their common node also acts as an output terminal, and the output voltage from this terminal is supplied to one of the input terminals of an operational amplifier 11 via a capacitor $C_1$. Between the power source Vcc and the ground is connected a resistance voltage divider comprising serially connected resistances r1 and r2. The voltage from this divider is supplied as a reference voltage Vref at the other input terminal of the amplifier 11. Resistance Rf sets the amplification of the amplifier 11 and is connected between the other input terminal and the output terminal of the amplifier 11.

Two magnetic resistance elements m1 and m2 are disposed so as to oppose the ring magnet that rotates integrally with a rotor of the motor but in a staggering phase in the circumferential direction. When the ring magnet rotates, sine wave signals are outputted from the common node of the two elements m1 and m2 and are supplied to one of the input terminals of the amplifier 11. The signals supplied to the other input terminal of the amplifier, on the other hand, are the voltage dividing signals or the reference voltages Vref of the resistance voltage divider comprising resistances r1 and r2. The amplifier 11 amplifies and provides the sine wave signals as an output at the node of the two magnetic resistance elements m1 and m2.

According to the prior art magnetic detectors discussed above, any difference between the reference voltage Vref of the amplifier 11 determined by the voltage ratio of resistances r1 and r2 and the mid-point voltage of the magnetic resistance elements m1 and m2 would cause the amplifier 11 to amplify the common-mode noises superposed on the power source line in correspondence to the difference between the reference voltage Vref and the mid-point voltage of the elements m1 and m2 as well as with the amplification factor of the amplifier 11. This adversely affected the output signals of the amplifier 11. The reasons for this are explained below.

The above mentioned common-mode noises are those having the same phase among the noises carried on the voltage that creates the mid-point voltage of the elements m1 and m2 and the mid-point voltage Vref between the elements m1 and m2, and indicated by the letter e in FIG. 9. The common-mode noise e may be represented as superimposed on the power source voltage Vcc. Assuming that the common-mode noise appearing at the mid-point of the elements m1 and m2 is Km·e, the difference voltage $\Delta e$ of the noises between these two mid points is expressed by the following equation:

$$\Delta e = (Kr - Km)e$$

wherein $$Km = m2/(m1+m2)$$

$$Kr = r2/(r1+r2)$$

The amplification factor of the amplifier 11 is calculated. As shown in FIG. 10, when the output resistance of the magnetic resistance element is Rim, the amplification A of the amplifier 11 becomes $$A = Rf/(Ri+Rim)(\times 2)$$

The amplification A amplifies the above mentioned noise difference voltage $\Delta e$. In other words, noises present in the output of the magnetic detector are expressed as $$\Delta e \cdot A$$

and the noise amplification N as $$N = (\Delta e/e) \cdot A (\times 2)$$

Noise is thus amplified and affects the output signals of the amplifier 11 adversely.

As is clear from the above going explanation, noises are amplified when there are differences between the DC component of the mid-point output voltage of the magnetic resistance elements m1 and m2 and the mid-point voltage of the resistances r1 and r2. When there are no such differences in voltage between these midpoints, noises are not amplified. Assuming the power source voltage Vcc to be 5 V, 4 V on the upper side is used as an effective range since 1 V on the lower side cannot be used. Thus, the mid-point voltage of the resistances r1 and r2 as the reference voltage Vref of the amplifier 11 is set at 3 V which is the midpoint between 1 V and 5 V. As an amplifier 11 is generally constructed of ICs, it is difficult to change the reference voltage Vref. On the other hand, the resistance ratio of the elements m1 and m2 is set at 1:1 as mentioned above in order to obtain the sine wave signals. Thus, the DC component of the mid-point output voltage of the elements m1 and m2 becomes 2.5 V or the midpoint of 5 V current source voltage Vcc. There is a difference of 0.5 V between 3 V, the mid-point voltage of the resistances r1 and r2 and the DC component 2.5 V of the mid-point voltage of the elements m1 and m2. The noises are amplified by this difference in voltage by the above mentioned noise amplification N, affecting the output signals of the amplifier 22 adversely. The effect is greater if the amplification of the amplifier 11 is greater.

SUMMARY OF THE PRESENT INVENTION

A primary object of the present invention is to overcome these problems of the prior art. The present invention aims to offer a magnetic detector which decreases the influences of the common-mode noises superposed on the power source line by equalizing the DC component of the mid-point voltage of the magnetic resistance elements with the reference voltage of the amplifier.

In accordance with the invention, a magnetic detector comprises two magnetic resistance elements, having a predetermined resistance ratio, connected serially between a power source and ground, and an output terminal connected to a common node of the two magnetic resistance elements for providing an output voltage. The output voltage from the output terminal is supplied to one of two output terminals of an operational amplifier. The voltage from a resistance voltage divider disposed between the power source and ground is supplied to the other input terminal of the amplifier. Resistance means are included for modifying the resistance ratio between the two magnetic resistance elements so as to equalize the DC component of the output voltage and the divided voltage. In this way, common mode noise level effects of the power source are substantially eliminated.

For a better understanding of the present invention, reference is made to the following description and accompanying drawings while the scope of the invention will be pointed out in the appended claims.

BRIEF DESCRIPTION OF THE DRAWINGS

FIG. 3 is a schematic circuit diagram showing a second embodiment and a modification of the magnetic detector according to this invention.

FIG. 4 is a schematic circuit diagram showing a third embodiment of the magnetic detector according to this invention.

DESCRIPTION OF THE PREFERRED EMBODIMENTS

The embodiments of magnetic detector according to the present invention are now explained by referring to FIGS. 1 through 4.

Figure 1:
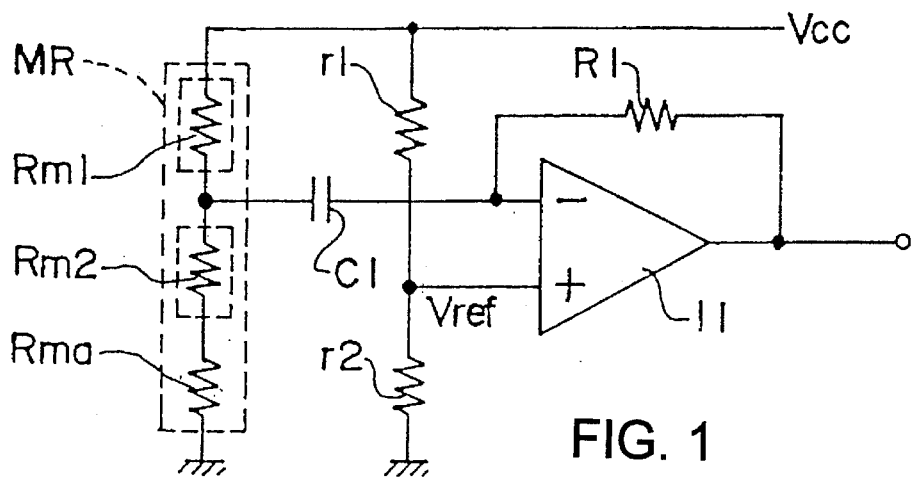
FIG. 1 is a schematic circuit diagram illustrating the first embodiment of the magnetic detector according to this invention.

FIG. 1 shows a first embodiment wherein two magnetic resistance elements Rm1 and Rm2 are serially connected with magnetic resistor Rma between the power source Vcc and the ground. The resistances of the two elements have the relation of 1:1. Two elements RM1 and Rm2 and the resistor Rma are formed on the same chip (Chip MR). However, two elements Rm1 and Rm2 are sensitive to magnetism of the magnet disposed opposite to the chip MR, whereas the resistor Rma is disposed at a position that would not detect the magnetism of the magnet (such as a position not opposing the magnet), or at a position where magnetic lines would be formed perpendicular to the direction of magnetic lines of the elements Rm1 and Rm2. The two elements Rm1 and Rm2 are constructed as a unilateral bridge, using the node therebetween as an output terminal and the output voltage of the terminal is supplied to one of the input terminals of the operational amplifier 11 via capacitor C1. On the other hand, there is connected a voltage divider comprising serially connected resistances r1 and r2 between the power source Vcc and the ground. The voltage of the resistance voltage divider is supplied to the other input terminal of the amplifier 11 as a reference voltage Vref. Between one of the input terminals and the output terminal of the amplifier 11 is connected a resistance R1 which determines the amplification factor of the amplifier 11.

The magnetic resistor Rma is connected between the magnetic resistance element Rm2 and ground. The resistor Rma equalizes the DC component of the output voltage from the common node of the serially connected resistances Rm1 and Rm2 and the divided voltage formed by the resistances r1 and r2. Assuming, for instance, that the power source voltage Vcc is 5 V and the divided voltage of the reference voltage Vref formed by the resistances r1 and r2 of the amplifier is 3 V, and assuming further that there exists no magnetic resistor Rma, the DC component of the output voltage from the node of the elements Rm1 and Rm2 becomes 2.5 V to make the voltage difference of 0.5 V. The magnetic resistor Rma is thus serially connected to two magnetic resistance elements Rm1 and Rm2 in order to eliminate the above mentioned difference in voltage that occurs as a result of a disturbed balance at the mid point of Rm1 and Rm2. The relation among resistances at that time is expressed as $$Rm1:(Rm2+Rma)=r1:r2$$

By connecting in series the two magnetic resistance elements Rm1 and Rm2 with the magnetic resistor Rma to equalize the DC component of the output voltage of the elements Rm1 and Rm2 and the divided voltage of resistances r1 and r2, common-mode noises which are superposed on the current source line are not amplified by the amplifier 11. As the magnetic resistor Rma is formed on the same chip using the same material as the elements Rm1 and Rm2, there are no temperature-dependent changes in the resistance ratio between the elements Rm1 and Rm2 and the magnetic resistor Rma, and the overall precision of the magnetic resistance elements can be maintained at a high level. Further advantage of the present invention lies in that the magnetic resistor Rma and the magnetic resistance elements Rm1 and Rm2 can be formed simultaneously with the same material by the same method on the same chip, thus not requiring any increase in costs.

The level of output signals of the magnetic resistance elements Rm1 and Rm2 is lowered by the addition of the magnetic resistor Rma, but the signals of the same level as that obtained without the magnetic resistor Rma may be provided simply by controlling the gains of the amplifier 11.

Figure 2A:
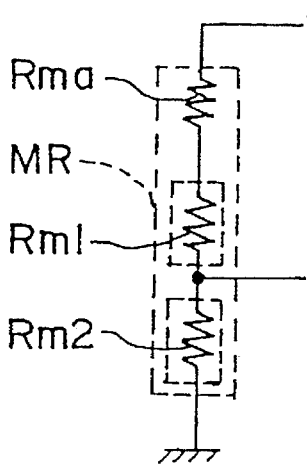
FIG. 2 is a schematic circuit diagram showing the essential parts of a modified version of the first embodiment of the magnetic detector according to this invention.

A modified version of the first embodiment is now explained. In order to equalize the DC component of the output voltage of the magnetic resistance elements Rm1 and Rm2 and the divided voltage by the resistances r1 and r2, a magnetic resistor Rma may be connected serially on the top side of the two elements Rm1 and Rm2 that are serially connected or between the source Vcc and the magnetic resistance element Rm$_1$ as shown in FIG. 2(a). The reference voltage Vref which is the voltage ratio of the resistances r1 and r2, shown in FIG. 1, may be set lower than ½ of the source voltage Vcc. In this case, the magnetic resistor Rma may be connected as shown in FIG. 2(a) in order to equalize the DC component of the output voltage of the elements Rm1 and Rm2 and the divided voltage by the resistances r1 and r2. The magnetic resistor Rma is also formed in a not magnetically sensitive manner. The relation of resistances among elements is expressed by the following equation:

$$(Rma+Rm1):Rm2=r1:r2$$

Figure 2B:
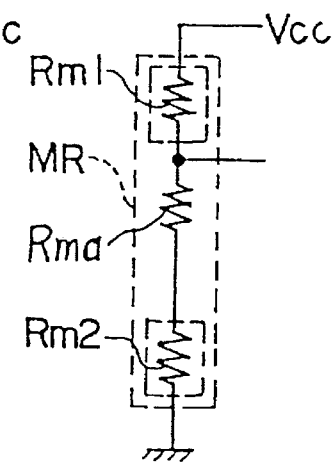
Figure 2C:
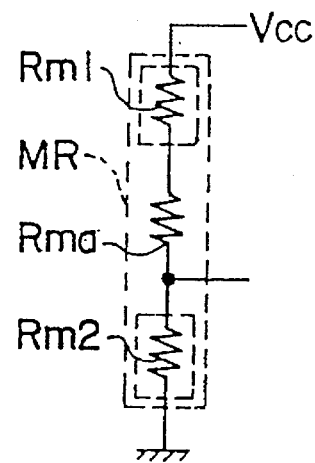

The magnetic resistor Rma comprising two magnetic resistance elements Rm1 and Rm2 connected serially may be provided between the two elements Rm1 and Rm2 as shown in FIGS. 2(b) and 2(c). The embodiment of FIG. 2(b) shows an output terminal provided at a node of the element Rm1 and the resistor Rma as the latter is connected to the side of the element Rm2 substantially similarly to the one shown in FIG. 1. The embodiment of FIG. 2(c) shows that magnetic resistor Rma is connected to the magnetic resistance element Rm1 and an output terminal is provided at the node of the element Rm2 and the resistor Rma. It is substantially the same as the example in FIG. 2(a). In any event, the resistor Rma is disposed in a non-magnetically sensitive manner as in the above mentioned embodiments.

Embodiment 2 is now explained. In this embodiment, the magnetic resistor may be connected in parallel with at least one of the two magnetic resistance elements Rm1 and Rm2 for equalizing the DC component of the output voltage of the magnetic resistance elements Rm1 and Rm2 and the voltage divided by the resistances r1 and r2. FIG. 3 shows such an example wherein the magnetic resistor Rmb is connected in parallel with one of the magnetic resistance elements Rm1. The relation among resistances is expressed by the equation:

$$Rm1 \cdot Rmb/(Rm1+Rmb):Rm2=r1:r2$$

In the case of FIG. 3(b), the magnetic resistor Rmb is connected in parallel with the other magnetic resistance element Rm2. The relation among resistances in this embodiment is expressed by the following equation:

$$Rm1:Rm2 \cdot Rmb/(Rm2+Rmb)=r1:r2$$

In the embodiments shown in FIG. 3, the magnetic resistor Rmb is disposed on the same chip as the elements Rm1 and Rm2 but in a non-magnetically sensitive manner.

When a magnetic resistor is to be connected serially to two magnetic resistance elements Rm1 and Rm2, it may be connected on two sides, the side of Rm1 and that of Rm2. Similarly, when a resistor is to be connected in parallel to the two elements Rm1 and rm2, the magnetic resistor may be connected respectively in parallel to the two magnetic resistance elements Rm1 and Rm2. At any rate, it suffices so long as the connection of the magnetic resistor will equalize the DC component of the output voltage of the elements Rm1 and Rm2 and the divided voltage of the resistances r1 and r2.

According to Embodiments 1 and 2 discussed above, the magnetic resistor disposed in a non-magnetically sensitive manner is connected serially to two magnetic resistance elements, or in parallel to one of the two elements, but the object of the present invention can be achieved without adding the magnetic resistor which is not magnetically sensitive. In sum, the resistance balance of the above mentioned two magnetic resistance elements should be broken to equalize the DC component of the output voltage provided at the node of the two magnetic resistance elements or an input of the amplifier and the divided voltage from the voltage divider or the other input of the amplifier.

FIG. 4 shows a third embodiment of the present invention wherein two magnetic resistance elements Rm1 and Rm2 are formed in a manner sensitive to the magnetism of the magnet on a chip MR. There is formed no magnetic resistor which is not magnetically sensitive. The ratio of resistances of the two elements Rm1 and Rm2 is not 1:1. The balance between two elements Rm1 and Rm2 is broken so as to equalize the direct current component of the output voltage taken out of the node of two elements Rm1 and Rm2 with the divided voltage caused by the voltage divider resistances r1 and r2. In other words, the resistances may be set as in the following equation:

$$Rm1:Rm2=r1:r2$$

Figure 5:
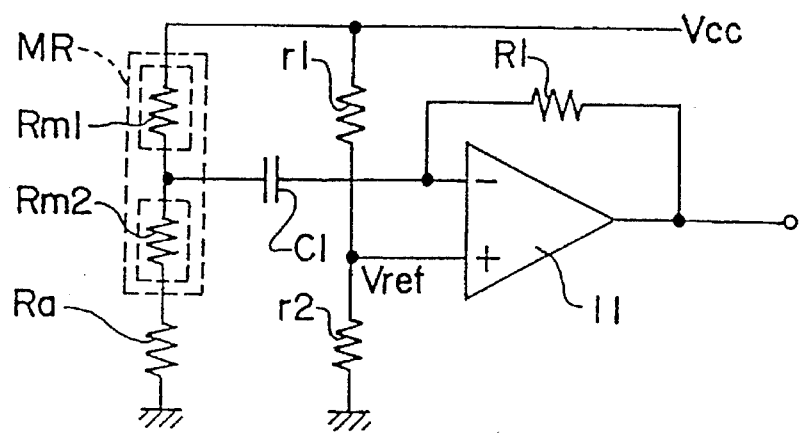
FIG. 5 is a schematic circuit diagram showing a fourth embodiment of the magnetic detector according to this invention.

By referring to FIG. 5, the fourth embodiment of the magnetic detector according to the present invention is now explained.

In FIG. 5, there are connected in series two magnetic resistance elements Rm1 and Rm2 and the resistance Ra between the current source Vcc terminal and the grounding terminal. The resistances of the two elements Rm1 and Rm2 assume the relation of 1:1. The two elements Rm1 and Rm2 are formed on the same chip (Chip MR). The two elements Rm1 and Rm2 are constructed as the unilateral bridge where the contact therebetween is used as an output terminal and the output voltage of the output terminal is supplied to one of the input terminals of the amplifier 11 via the capacitor C1. On the other hand, there is connected a voltage divider comprising two serially connected resistances r1 and r2 between the power source Vcc and the ground. The divided voltage of the divider is supplied as the reference voltage Vref into the other input terminal of the amplifier 11. There is connected a resistance $R_1$ between one of the input terminal and the output terminal of the amplifier 11 to determine the amplification thereof.

The above mentioned resistor Ra is connected between the magnetic resistance element Rm2 and the ground. The resistor Ra is for equalizing the DC component of the output voltage from the node of the magnetic resistance elements Rm1 and Rm2 which are serially connected and the divided voltage by the resistances r1 and r2. Assuming, for instance, that the power source voltage Vcc is 5 V and the voltage divided by the resistances r1 and r2 which is the reference voltage Vref of the amplifier 11 is 3 V, and if there is no resistor Ra, the DC component of the output voltage from the node of the elements Rm1 and Rm2 becomes 2.5 V, generating the difference of 0.5 V in voltage. In order to eliminate this difference by breaking the balance at the midpoint of the elements Rm1 and Rm2, the resistor Ra is connected serially to the two magnetic resistance elements Rm1 and Rm2. The relation among resistances is expressed by the following equation:

$$Rm1:(Rm2+Ra)=r1:r2$$

By serially connecting the resistor Ra to the two magnetic resistance elements Rm1 and Rm2, the DC component of the output voltage of the elements Rm1 and Rm2 and the voltage divided by the resistances r1 and r2 are equalized, the common-mode noises superposed on the power source line are no longer amplified by the amplifier 11, and the effects of such common-mode noises are reduced. As it is only necessary to attach the resistor Ra externally and there is no need to change the magnetic resistance elements Rm1, Rm2 or the circuit of the amplifier 11, the design efficiency is advantageously improved.

The level of the output signals from the magnetic resistance elements Rm1, Rm2 is lowered for the amount caused by addition of the resistor Ra. By regulating the gains of the amplifier 11, it is possible to provide output signals of the level equal to the case where no resistor Ra has been added.

Figure 6:
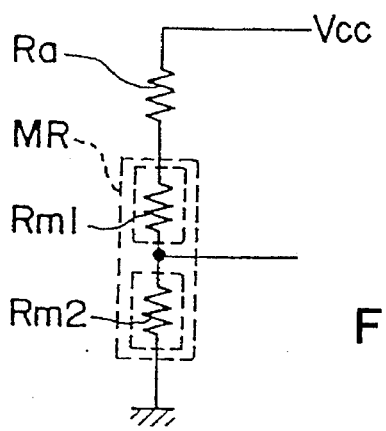
FIG. 6 is a schematic diagram illustrating the essential parts of a modified version of the fourth embodiment of the invention.

In order to equalize the DC component of the output voltage of the magnetic resistance elements Rm1 and Rm2 and the voltage divided by the resistances r1 and r2, the resistor Ra may be connected serially above the serially connected two elements Rm1, Rm2 as shown in FIG. 2. In other words, the resistor Ra may be connected between the current source Vcc terminal and the magnetic resistance element Rm1. The reference voltage Vref which is the voltage ratio divided by the resistances r1 and r2 shown in FIG. 5 may be lower than ½ of the source voltage Vcc. In this case, connection of the resistor Ra as in the case of FIG. 6 will equalize the DC component of the output voltage of the elements Rm1 and Rm2 and the voltage divided by the resistances r1 and r2.

Figure 7:
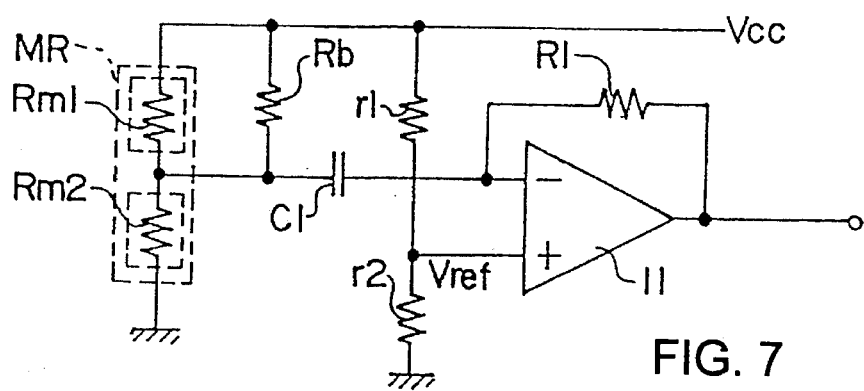
FIG. 7 is a circuit diagram showing a fifth embodiment of the magnetic detector according to this invention.

Embodiment 5 is also explained by referring to FIG. 7. The resistance to equalize the DC component of the output voltage of the magnetic resistance elements Rm1 and Rm2 and the voltage divided by the resistances r1 and r2 may be connected in parallel to at least one of the two magnetic resistance elements. FIG. 7 shows an example thereof wherein the resistance Rb is connected in parallel to one of the elements Rm1. The relation among resistances at that time is expressed by the following equation:

$$Rm1 \cdot Rb/(Rm1+Rb):Rm=r1:r2$$

Figure 8:
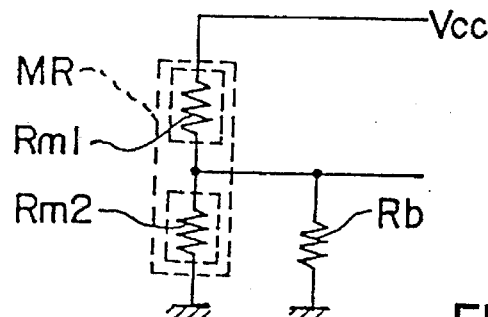
FIG. 8 is a circuit diagram showing the essential parts of the sixth embodiment of the magnetic detector according to this invention.
Figure 9:
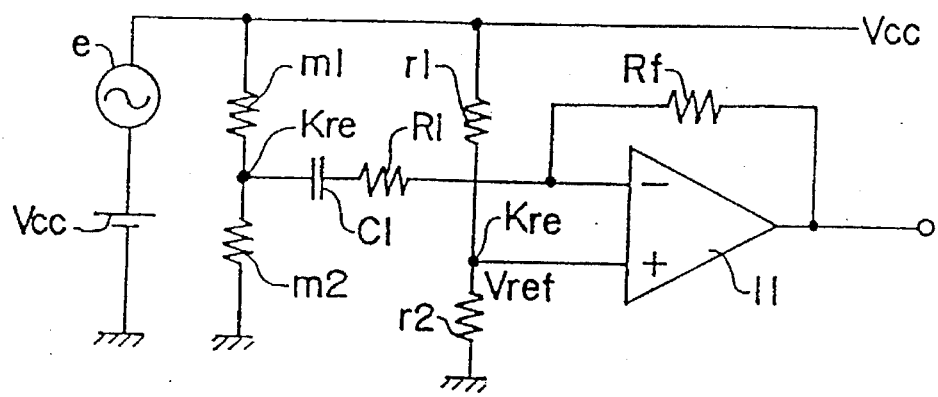
FIG. 9 is a circuit diagram to equivalently show a prior art magnetic detector.
Figure 10:
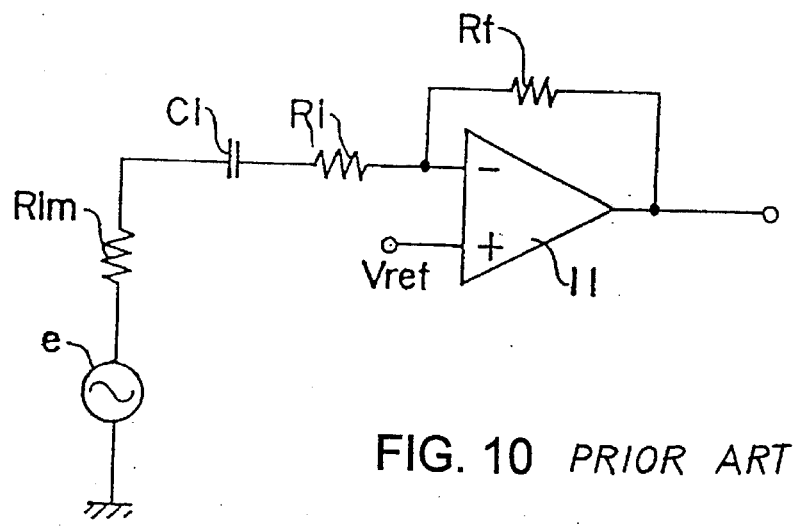
FIG. 10 is a circuit diagram to equivalently show a portion of the prior art detector.

FIG. 8 shows a sixth embodiment wherein resistances are connected in parallel to a magnetic resistance element; the resistor Rb is connected in parallel to the other element Rm2.

When connecting the resistance serially to two elements Rm1, Rm2, it may be connected to the side of the element Rm1 and that of the element Rm2. Similarly, when the resistance is connected in parallel to two elements Rm1 and Rm2, it may be connected respectively in parallel to both the elements Rm1 and Rm2. At any rate, connection of the resistance should achieve equalization of the DC component of the output voltage of the elements Rm1 and Rm2 and the voltage divided by the resistances r1 and r2.

According to the present invention, in a magnetic detector comprising two magnetic resistance elements serially connected between the current source terminal and the grounding terminal, an output terminal connected to the point where the two elements are connected, the output voltage of the output terminal being supplied to one of the input terminals of the amplifier and the divided voltage of the voltage divider provided between the power source and the ground supplied to the other input terminal of the amplifier, magnetic resistances disposed in a non-magnetically sensitive manner are connected serially to said two elements or in parallel to at least one of the two elements, or by causing the loss of resistance balance of the two elements, the DC component of the output voltage at the node of the two magnet resistance elements or an input of the amplifier, and the voltage divided by the voltage divider or another input for the amplifier are equalized and the common-mode noises superposed on the current source line are prevented from becoming amplified by the amplifier and the effect of such noises is lessened. As the magnetic resistances connected in series or in parallel to the magnetic resistance elements may be formed on the same chip, the effect of temperature characteristics on the magnetic resistance elements can be advantageously cancelled. When the balance in resistance of the two elements is disturbed, the effects of the temperature characteristics may also be cancelled.

By connecting a resistance with the two magnetic resistance elements in series or in parallel to at least one of the two magnetic resistance elements, the DC component of the output voltage at the node of the two elements acting as an input from the amplifier and the voltage divided by the voltage divider acting as another input for the amplifier are equalized. Thus the common-mode noises superposed on the current source line are not amplified by the amplifier and their effects are reduced. As the resistance can be attached externally, there is no need to change the magnetic resistance elements or the amplifier circuit, thus improving the design efficiency.

While the foregoing description and drawings represent the preferred embodiments of the present invention, it will be obvious to those skilled in the art that various changes and modifications may be made therein without departing from the true spirit and scope of the present invention.

What is claimed is:

1. A magnetic detector comprising: two magnetic resistance elements having a predetermined resistance ratio connected serially between a power source and ground, said power source being subject to a noise level which may have a common mode effect on the detector; an output terminal connected to a common node of the two magnetic resistance elements for providing an output voltage; said output voltage from the output terminal being supplied to one of two input terminals of an operational amplifier; a resistance voltage divider disposed between said power source and ground for supplying a divided voltage to the other input terminal of said amplifier; and resistance means for modifying the resistance ratio between the two magnetic resistance elements so as to make the DC component of said output voltage equal to said divided voltage; whereby common mode noise level effects of the power source on the detector are substantially eliminated.

2. The magnetic detector as claimed in claim 1 wherein said resistance means includes a magnetic resistor serially connected to said two magnetic resistance elements in a non-magnetically sensitive manner to make the DC component of the output voltage equal to the divided voltage.

3. The magnetic detector as claimed in claim 1 wherein said resistance means includes a magnetic resistor disposed in a non-magnetically sensitive manner connected in parallel to at least one of the two magnetic resistance elements to make the DC component of the output voltage equal to the divided voltage.

4. The magnetic detector as claimed in claim 1 wherein said resistance means includes a resistance serially connected to the two magnetic resistance elements to make the DC component of the output voltage equal to the divided voltage.

5. The magnetic detector as claimed in claim 1 wherein said resistance means includes a resistance connected in parallel to at least one of the two magnetic resistance elements to make the DC component of the output voltage equal to the divided voltage.

6. In a frequency generator for incorporation into a motor for providing a signal representing the rotational rate of a motor, said frequency generator having a magnetic detector including resistance elements and an operational amplifier having two input terminals, said magnetic resistance elements having a predetermined resistance ratio and being connected serially between a power source and ground, said power source being subject to a noise level which may have a common mode effect on the detector; an output terminal connected to a common node of the two magnetic resistance elements for providing an output voltage; the output voltage from the output terminal being supplied to one of two input terminals of said amplifier; a resistance voltage divider disposed between the power source and ground for supplying a divided voltage to the other input terminal, the improvement comprising:

resistance means for modifying the resistance ratio between the two magnetic resistance elements so as to make the DC component of said output voltage equal to said divided voltage, whereby common mode noise level effects of the power source on the detector are substantially eliminated.

* * * * *